United States Patent
Lin

(10) Patent No.: US 8,219,343 B2
(45) Date of Patent: Jul. 10, 2012

(54) METHOD AND APPARATUS FOR CALIBRATING A DELAY CHAIN

(75) Inventor: Chia-Liang Lin, Fremont, CA (US)

(73) Assignee: Realtek Semiconductor Corp., Science-Based Industrial Park, Hsinchu (TW)

( * ) Notice: Subject to any disclaimer, the term of this patent is extended or adjusted under 35 U.S.C. 154(b) by 644 days.

(21) Appl. No.: 12/394,846

(22) Filed: Feb. 27, 2009

(65) Prior Publication Data

US 2009/0267668 A1 Oct. 29, 2009

Related U.S. Application Data

(60) Provisional application No. 61/047,733, filed on Apr. 24, 2008.

(51) Int. Cl.
*G01R 35/00* (2006.01)
(52) U.S. Cl. .......................... 702/89; 702/179
(58) Field of Classification Search ............ 702/89, 702/176; 333/144; 327/146–149, 158, 261
See application file for complete search history.

(56) References Cited

U.S. PATENT DOCUMENTS

| 5,124,568 | A | | 6/1992 | Chen et al. | |
|---|---|---|---|---|---|
| 6,094,082 | A | * | 7/2000 | Gaudet | 327/270 |
| 7,603,095 | B2 | * | 10/2009 | Yang et al. | 455/260 |
| 7,932,847 | B1 | | 4/2011 | Hsieh et al. | |
| 7,999,584 | B2 | * | 8/2011 | Rhee et al. | 327/156 |
| 2006/0184333 | A1 | * | 8/2006 | Stern | 702/106 |
| 2007/0268054 | A1 | | 11/2007 | Uemura et al. | |
| 2009/0261878 | A1 | | 10/2009 | Lin | |

FOREIGN PATENT DOCUMENTS

JP 1-304518 A 12/1989

OTHER PUBLICATIONS

"U.S. Appl. No. 12/394,888, Non Final Office Action mailed Jul. 22, 2011", 6 pgs.
"U.S. Appl. No. 12/394,888, Notice of Allowance mailed Nov. 18, 2011", 8 pgs.
"U.S. Appl. No. 12/394,888, Response filed May 6, 2011 to Restriction Requirement mailed Apr. 6, 2011", 7 pgs.
"U.S. Appl. No. 12/304,888, Response filed Oct. 24, 2011 to Non Final Office Action mailed Jul. 22, 2011", 10 pgs.
"U.S. Appl. No. 12/394,888, Restriction Requirement mailed Apr. 6, 2011", 5 pgs.
"Chinese Application Serial No. 200910132137.1, Office Action mailed Jun. 9, 2011", 8 pgs.
"Chinese Application Serial No. 200910132137.1, Office Action mailed Nov. 9, 2011", 7 pgs.

* cited by examiner

*Primary Examiner* — Mohamed Charioui
*Assistant Examiner* — Elias Desta
(74) *Attorney, Agent, or Firm* — Winston Hsu; Scott Margo

(57) ABSTRACT

Apparatus and methods are provided for calibration within a delay chain. In various embodiments, such apparatus and techniques can be used to address delay mismatch, but are not limited to such applications. Additional apparatus, systems, and methods are disclosed.

19 Claims, 11 Drawing Sheets

METHOD AND APPARATUS FOR CALIBRATING A DELAY CHAIN

RELATED APPLICATIONS

This application claims the benefit under 35 U.S.C. 119(e) of U.S. Provisional Patent Application Ser. No. 61/047,733 filed Apr. 24, 2008, which is incorporated herein by reference in its entirety. This application is related to U.S. patent application Ser. No. 12/394,888 tiled on Feb. 27, 2009, which is incorporated by reference in its entirety.

FIELD OF TECHNOLOGY

This disclosure relates generally to delay chains.

BACKGROUND

A delay chain is a circuit for generating a multi-phased clocking signal and is used in circuits such as delay-lock loops, phase lock loops, and time-to-digital converters. A delay chain may include a plurality of delay cells cascaded in sequence. Each delay cells introduces a nominal delay. Various delay chain designs include delay cells intended to execute identical delays. Generally, however, there is usually a mismatch between delay cells and thus, their delays are different. Differences in delays between cells may be due to such things as manufacturing and material variances. As a result, the sequential outputs of the delay cells are usually not uniformly displaced in time. It is desirable to calibrate out the delay mismatch to alleviate the non-uniformity. Some present methods rely on statistical approaches to calibrate the mismatch. A statistical approach, although useful, demands significant overhead in both circuit area and power consumption.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

In an embodiment, a variable delay cell within a delay chain can be calibrated. The method comprises receiving a target delay interval, selectively amplifying a time difference between an output signal and an input signal of the variable delay cell to generate an amplified time difference, digitalizing the amplified time difference into a digital delay value, and adjusting the variable delay cell in accordance with a comparison between the digital delay value and the value of the target delay interval.

In an embodiment, an apparatus includes a self-calibrating delay chain. The apparatus comprises a delay chain having a plurality of sequential delay outputs and a calibration circuit connected to the delay chain, wherein the calibration circuit is configured to automatically calibrate each sequential delay interval between two sequential delay outputs of the plurality of sequential delay outputs such that each sequential delay interval is essentially the same as each other sequential delay interval of the plurality of sequential delay outputs.

Figure 1A:
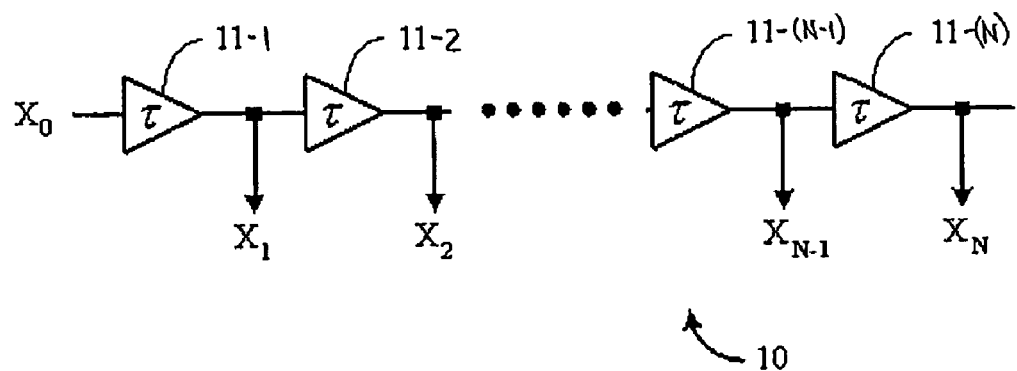
FIG. 1A shows a delay chain, according to an embodiment of the invention.
Figure 1B:
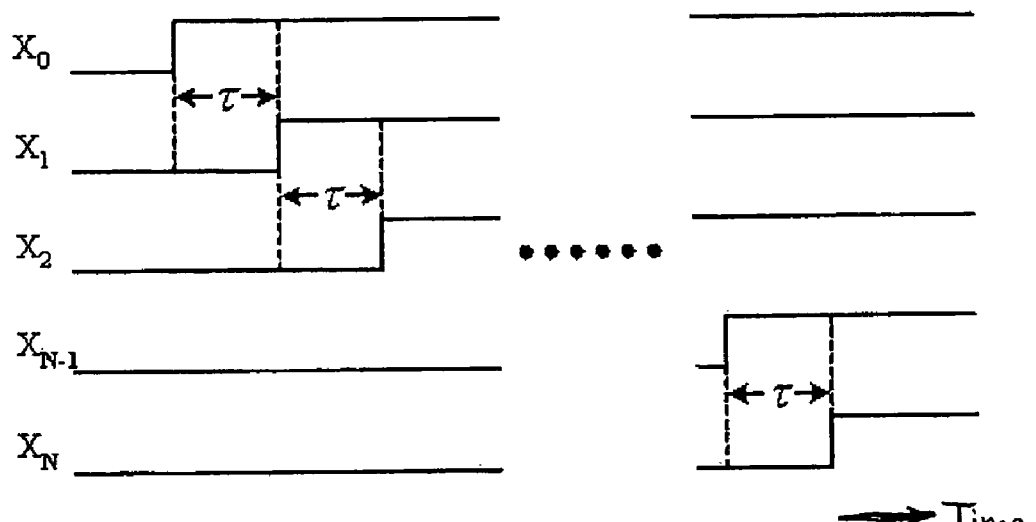
FIG. 1B shows a timing diagram of the delay chain of FIG. 1A.

As depicted in FIG. 1A, a delay chain 10 comprises a plurality of delay cells 11-1, 11-2, . . . , 11-(N-1), 11-(N) cascaded in sequence. Each of delay cells 11-1, 11-2, . . . , 11-(N-1), 11-(N) introduces a nominal delay, $\tau$, between the input of the cell and the output. Delay chain 10 receives an input signal $X_0$ and outputs a plurality of delayed signals $X_1$, $X_2$, . . . , $X_N$. Ideally, the input $X_0$ signal and the delayed signals $X_1$, $X_2$, . . . , $X_N$, have the same waveform but are uniformly displaced in time with a spacing of $\tau$, as illustrated in the timing diagram shown in FIG. 1B. Some delay cells comprise two CMOS (complementary metal-oxide semiconductor) inverters cascaded in sequence, and the delay (i.e. $\tau$) associated with such a delay cell is determined in part by physical dimensions of the inverters and supply voltage. Various delay chain designs include delay cells intended to execute identical delays.

Devices using delay chains rely on precision timing of the chain to operate properly. Due to manufacturing and material variances, it is common for delay intervals of delay cells within a delay chain to vary for a given setup. To correct such delay variances, an efficient and accurate measurement of the delays associated with each delay cell should be performed. A time-to-digital converter (TDC) is an apparatus useful for measuring a delay associated with a delay cell. However, the accuracy of TDC measurements is limited to the resolution of the TDC. In present CMOS integrated circuits, TDC resolution is about a few picoseconds. In some situations, delays of a delay cell are on the order of a few tens of picoseconds. Thus, in practice, a TDC may not offer a resolution fine enough to accurately measure delay of a delay cell.

A time amplifier is an apparatus useful for amplifying a time difference. A time amplifier with a gain of 50, for instance, receives two input signals with a time difference of 20 picoseconds and generates two output signals with a time difference of 1000 (i.e. 20×50) picoseconds. A delay associated with a delay cell is a time interval between receiving an input signal transition and generating a corresponding output signal transition. By using a time amplifier to amplify the time interval by an amplification factor G and then measuring the amplified time interval using a TDC, one can relax the requirement on the resolution of the TDC by the amplification factor G. This effectively alleviates the problem of sufficient TDC resolution to accurately measure delay associated with a delay cell. In various embodiments, a time amplifier can be utilized to allow an accurate measurement of delays associated with delay cells within a delay chain so as to effectively correct the variances in delay among those delay cells.

Figure 2:
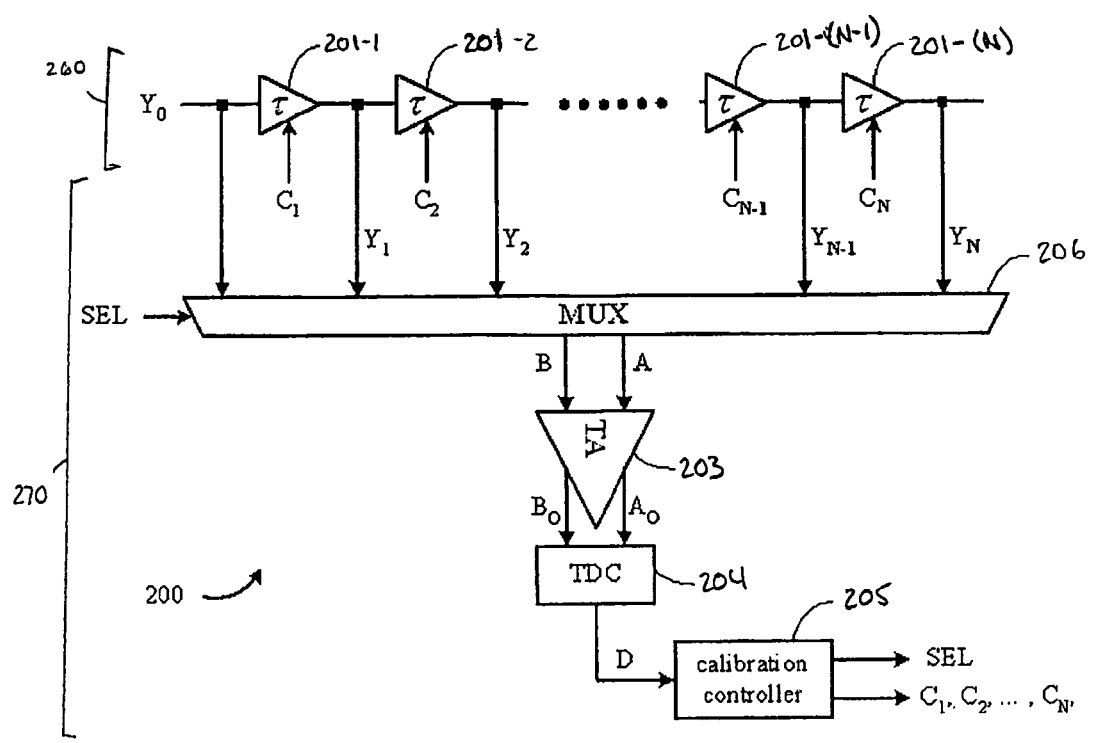
FIG. 2 shows a self-calibrating delay chain, according to an embodiment of the invention.

FIG. 2 shows a self-calibrating delay chain 200 according to an embodiment of the invention. The self-calibrating delay chain 200 includes a delay chain 260 and a calibration circuit 270. The delay chain 260 includes plurality of delay cells 201-1, 201-2, . . . , 201-(N−1), 201-(N), cascaded in sequence for receiving an input signal $Y_0$ and outputting a plurality of delayed signals $Y_1, Y_2, \ldots, Y_N$, in accordance with a plurality of control signals $C_1, C_2, \ldots, C_N$, respectively. The calibration circuit 270 of the self calibrating delay chain 200 includes a multiplexer (MUX) 206 for receiving the input signal $Y_0$ and the delayed signals $Y_1, Y_2, \ldots, Y_N$, and outputting two selected signals A and B. The signals A and B can be output by selecting among the received signals $Y_0, Y_1, Y_2, Y_3, \ldots Y_N$ in accordance with a selection signal SEL. The calibration circuit 270 further includes a time amplifier (TA) 203, a time-to-digital converter (TDC) 204, and a calibration controller 205. The time amplifier (TA) 203 is configured to receive the two selected signals A and B and to generate two time-stretched signals $A_O$ and $B_O$. The time-to-digital converter (TDC) 204 is configured to receive the two time-stretched signals $A_O$ and $B_O$ and generate a digital output D for quantifying a time difference between $A_O$ and $B_O$. The calibration controller 205 is configured to receive the digital output D and to generate the selection signal SEL signals and control signals $C_1, C_2, \ldots, C_N$.

The calibration controller 205 issues a selection signal SEL to select a delay cell for measurement. For instance, a first delay cell 201-1 is measured when the value of SEL is 1. As such, the time difference between $Y_1$ and $Y_0$ is amplified by time amplifier 203 and then detected via time-to-digital conversion (TDC) 204. Note that $Y_1$ is multiplexed into A, and $Y_0$ is multiplexed into be B. In the illustrated embodiment, when the SEL value is 2, a second delay cell 201-2 is measured. When the second delay cell is measured, $Y_2$ is multiplexed as signal A and $Y_1$ is multiplexed as signal B. When the SEL value is 3, a third delay cell is measured. When a subsequent delay cell 201-(N) is measured, $Y_N$ is multiplexed as signal A and $Y_{N-1}$ is multiplexed as signal B. The selection and multiplexing of additional delay cells follows the pattern. It is understood that other SEL values and multiplexing schemes can be realized according to various embodiments.

In an embodiment, when the SEL value is 1 and the delay of a first delay cell 201-1 is measured, the delay is amplified by a time amplifier 203, resulting in an amplified delay represented by a time difference between signals $A_O$ and $B_O$. The amplified delay is then converted into a digital output D by a TDC 204. If all delay cells are perfectly matched, the digital output D will have the same value regardless of the value of the selection signal SEL (i.e., regardless of which delay cell is to be measured). If two different values for the selection signal SEL lead to two different values in the digital output D, it indicates a mismatch between two delay cells, and the calibration controller can operate to adjust a related control signal $C_i$ to equalize the two delay cells. For instance, the values of the digital output D are $D_1, D_2$, respectively for the first two delay cells 201-1, 201-2, having control signal $C_1$ and $C_2$, respectively, when the values of the selection signal SEL are 1 and 2, respectively. In an embodiment, a greater value of C leads to a greater delay for a delay cell. If, for example, $D_2$ is greater than $D_1$, it indicates the second delay cell 201-2 has a greater delay than the first delay cell 201-1. In some embodiments, upon detection of such a delay difference, the calibration controller 205 increases $C_1$ so as to correct the mismatch between the delay cells. In various embodiments, the calibration controller 205 decreases $C_2$ to correct the mismatch between delay cells.

In various embodiments, during calibration, the calibration controller 205 measures the delay of a reference delay cell 201-1 by setting SEL=1. Upon measuring the delay, the calibration controller 205 acquires a first value, $D_1$, as a reference delay. The calibration controller 205 then measures the delay of a second delay cell 201-2 by issuing SEL=2 and acquiring a second value, $D_2$. The calibration controller 205 then adjusts the value for the control signal $C_2$ based on a comparison of $D_2$ with $D_1$. $C_2$ is incremented if $D_1 > D_2$, decremented if $D_2 > D_1$, or left unchanged if $D_2 = D_1$. The calibration controller 240 then measures the delay of another delay cell by issuing SEL=3 and acquiring a third value, say $D_3$, of the digital output D. The calibration control 205 adjusts the value for the control signal $C_3$ based on comparing $D_3$ with $D_1$. For instance, $C_3$ is incremented if $D > D_3$, decremented if $D_3 > D_1$, or left unchanged if $D_3 = D_1$. In this manner, delay cells are sequentially calibrated so as to make their respective delays match the reference delay of the first cell 201-1. This process is repeated until the digital output D has the same value regardless of which delay cell is selected. It is understood that other methods of establishing a reference can be realized according to various embodiments.

Figure 3:
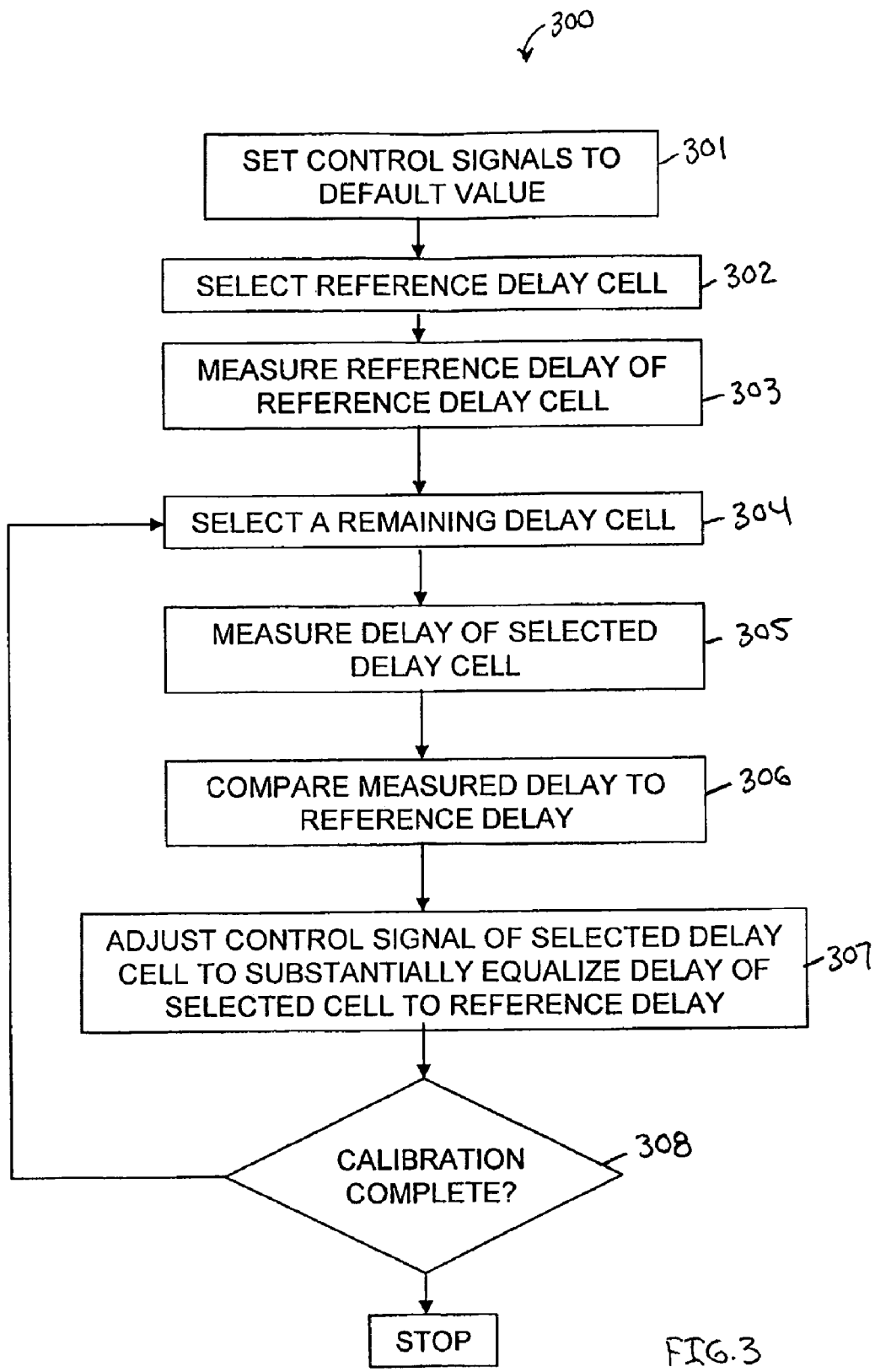
FIG. 3 shows features of a method for calibrating a delay chain, according to an embodiment of the invention.

FIG. 3 is a flowchart of a method 300 for calibrating a delay chain according to an embodiment of the invention. The method includes setting the control signal of the delay cells in the delay chain to a default value 301, selecting a reference delay cell 302, and measuring the delay of the reference delay cell as a reference delay 303. The method further includes selecting a remaining delay cell in the delay chain 304, measuring the delay of the selected delay cell 305, comparing the measured delay to the reference delay 306 and adjusting the control signal of the selected delay cell to substantially equalize the delay of the selected delay cell with the reference delay 307. The method further includes selecting remaining delay cells in the delay chain 304, measuring the delay of the selected delay cell 305, comparing 306 and adjusting 307 the delay cell to the reference delay cell until 308 all the delay cells have delays substantially equal to the delay of the reference delay cell.

Figure 4:
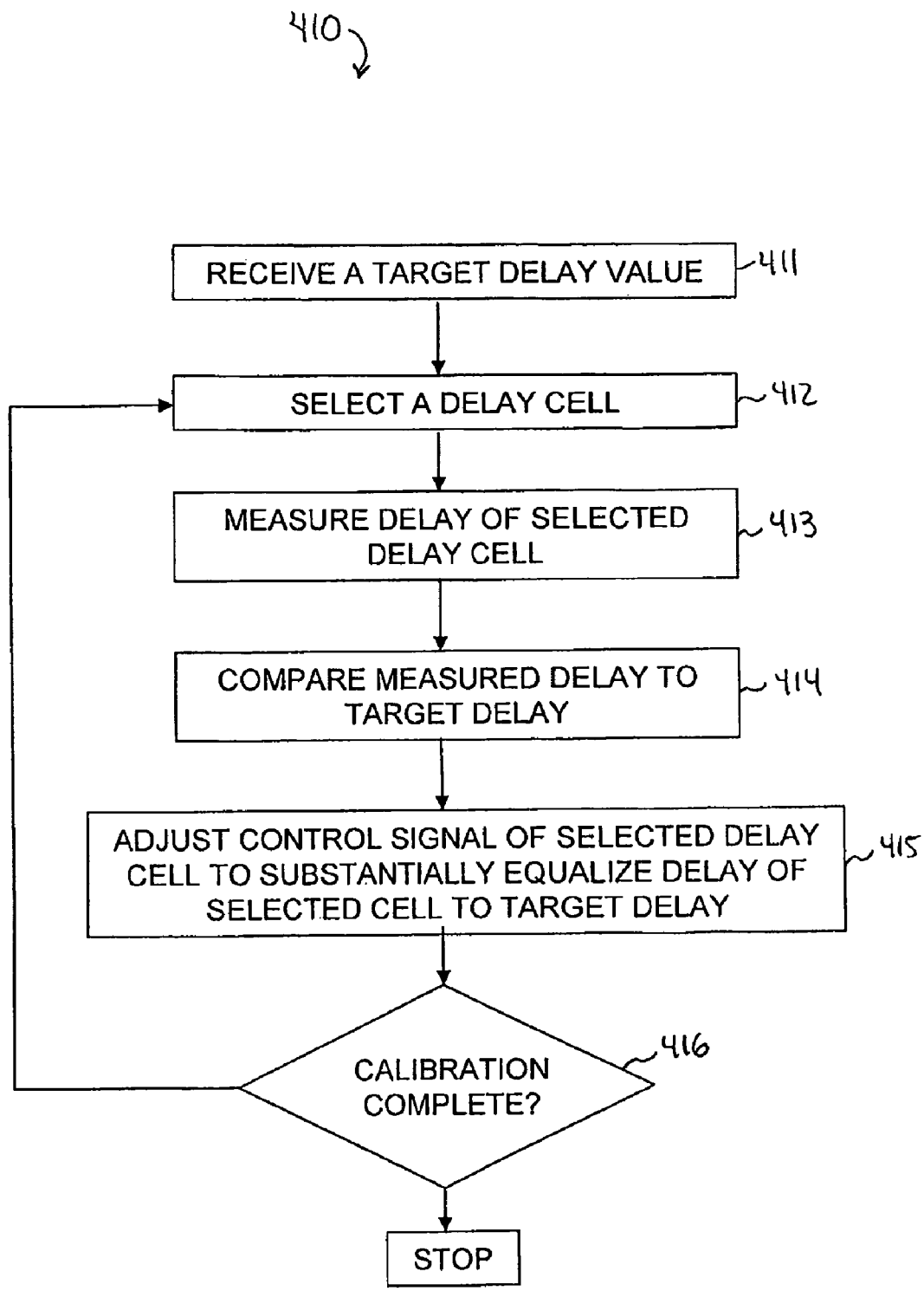
FIG. 4 shows features of a method for calibrating a delay chain, according to an embodiment of the invention.

FIG. 4 is a flowchart of a method 410 for calibrating a delay chain according to an embodiment of the invention. The method includes receiving a target delay 411 at the calibration controller, selecting a delay cell in the delay chain 412, measuring the delay of the selected delay cell 413, comparing the measured delay to the target delay 414 and adjusting the control signal of the selected delay cell to substantially equalize the delay of selected delay cell to the target delay 415. The method further includes selecting a remaining delay cell 412, measuring the delay value of the selected delay cell 413, comparing the measured delay with the target delay 414 and adjusting the selected control signal of the selected delay cell 415 until all remaining delay cells have delays substantially equal to the value of the target delay 416.

Calibration of delay chains, regardless of calibration algorithm, can be performed at system start-up, intermittently during a normal operation, or continuously during the normal operation in various embodiments. Even if a delay chain has been calibrated at system start-up, in various embodiments, it is desirable to at least intermittently calibrate the delay chain during operation, since variable factors, e.g. temperature drift, may lead to a change in circuit delay.

Figure 5:
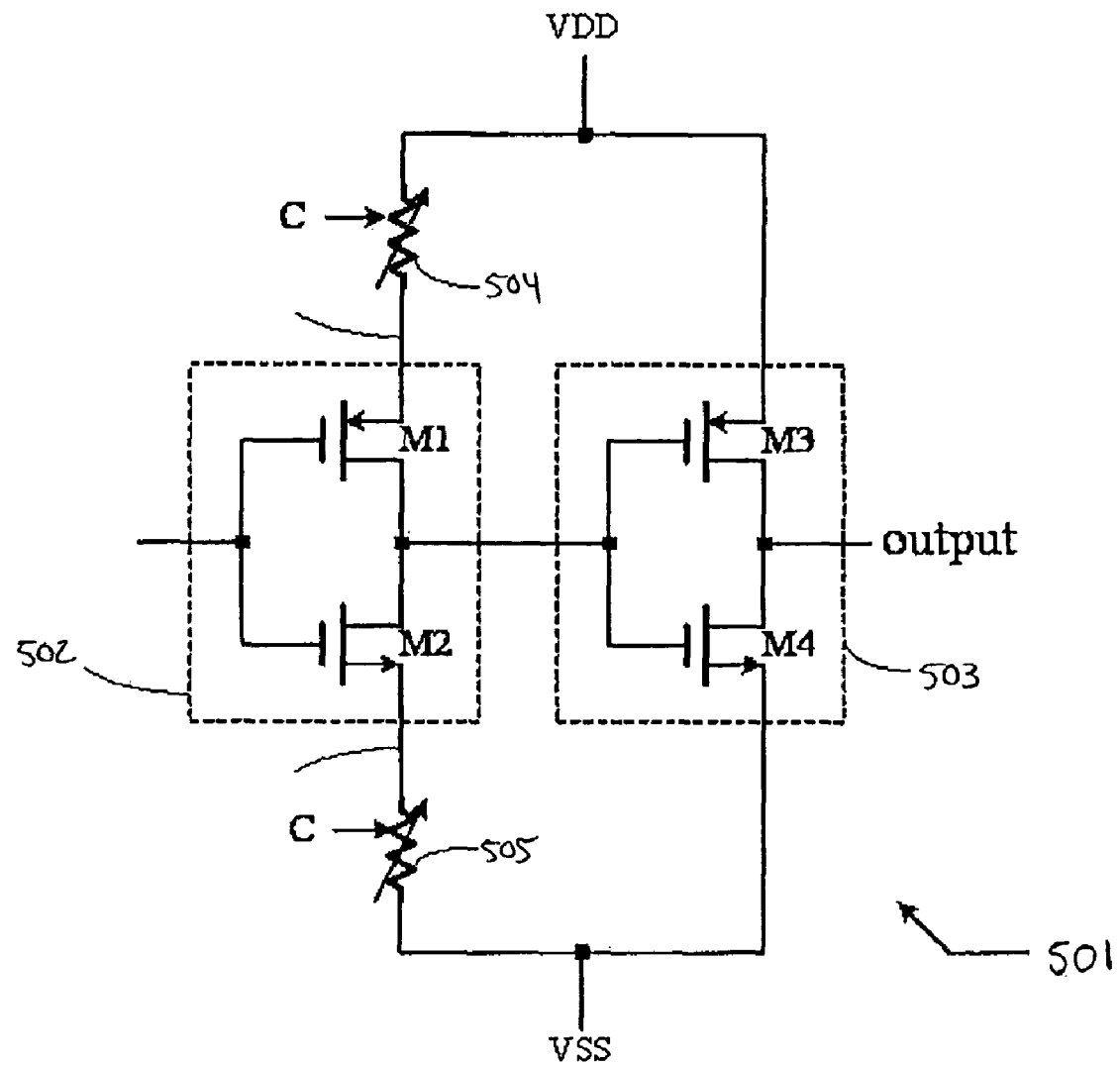
FIG. 5 shows a delay cell, according to an embodiment of the invention.

FIG. 5 shows a delay cell according to an embodiment of the invention. Delay cell 501 comprises two CMOS (complementary metal-oxide semiconductor) inverters 502 and 503 configured in a cascade topology. Each inverter 502, 503 comprises a PMOS (p-channel metal-oxide semiconductor) transistor M1, M3 and a NMOS (n-channel metal-oxide semiconductor) transistor M2, M4. Inverter 503 is directly coupled to a high voltage supply node VDD via its "ceiling" terminal and to a low voltage supply node VSS via its "floor" terminal. Inverter 502 is indirectly coupled to the high voltage supply node VDD via its "ceiling" terminal through a first variable resistor 504 and to the low voltage supply node VSS via its "floor" terminal through a second variable resistor 505. The variable resistors 504,505 are controlled by a control code C, which represents a control signal $C_i$, (I=1, 2, ..., N) when delay cell 501 is employed as a delay cell in the embodiment of FIG. 2. The variable resistors 504, 505 slow down the power delivery to the inverter 501 and, thus, regulates the delay of inverter 502. A greater resistance for the variable resistors 504, 505 leads to greater delay in inverter 502. Adjusting the resistance for the variable resistors 504, 505 in accordance with the control code C effectively adjusts the delay setpoint of inverter 502 and therefore the overall delay of the variable delay cell 501.

Figure 6A:
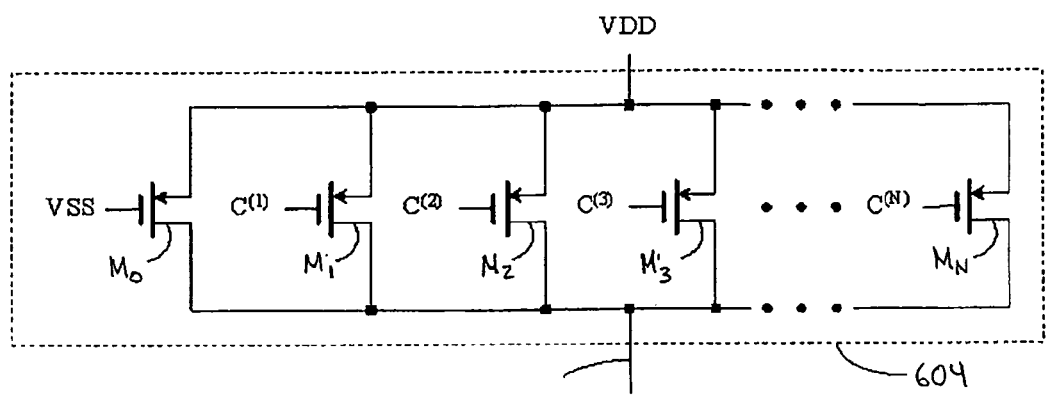
FIGS. 6A-6B shows a variable resistor, according to various embodiments of the invention.

FIG. 6A shows a variable resistor 604 according to an embodiment. The variable resistor 604 receives a command C including N binary codes $C^{(1)}$, $C^{(2)}$, $C^{(3)}$, ..., $C^{(N)}$. The illustrated embodiment is shown for connection as variable resistor 504 of FIG. 5. The variable resistor 604 comprises a parallel connection of a plurality of resistors embodied by a plurality of PMOS transistors (e.g., $M_0$, $M_1$, ... $M_N$). Each PMOS transistor has a low resistance value when a control voltage $C^{(i)}$ at its gate terminal is low (i.e. at the level of the low voltage supply node VSS) and a high resistance value when the control voltage $C^{(i)}$ at its gate terminal is high (i.e. at the level of the high voltage supply node VDD). Among those PMOS transistors: $M_0$ has a low resistance value as its gate terminal is tied to the low voltage supply node VSS, $M_1$, controlled by the binary code $C^{(1)}$, has a low resistance value when $C^{(1)}$ is 0 (i.e. low voltage or VSS) and a high resistance value when $C^{(1)}$ is 1 (i.e. high voltage or VDD), and transistor $M_N$, controlled by the binary code $C^{(N)}$, has a low resistance value when $C^{(N)}$ is 0 and a high resistance value when $C^{(N)}$ is 1. Thus, a greater value for the control code C leads to more binary codes being set to 1 among the N binary codes $C^{(1)}$, $C^{(2)}$, $C^{(3)}$, and so on, thus resulting in a higher resistance value for the variable resistor 604 and consequently a greater delay for a variable delay cell if used as variable resistor 504 of FIG. 5.

Figure 6B:
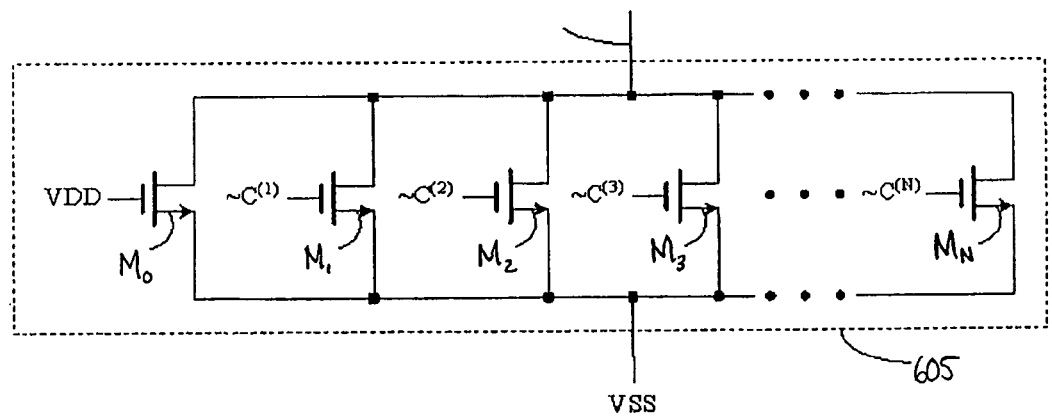

Using logical inversions of the N binary codes $C^{(1)}$, $C^{(2)}$, $C^{(3)}$, ..., $C^{(N)}$ (denoted as $\sim C^{(1)}$, $\sim C^{(2)}$, $\sim C^{(3)}$, ..., $\sim C^{(N)}$, respectively), an embodiment for the variable resistor 505 of FIG. 5 is shown in FIG. 6B. In this embodiment, variable resistor 605 comprises a parallel connection of a plurality of resistors embodied by a plurality of NMOS transistors (e.g., $M_0$, $M_1$, ..., $M_N$). Each NMOS transistor has a high resistance value when a control voltage at its gate terminal is low (i.e. at the level of the low voltage supply node VSS) and a low resistance value when the control voltage at its gate terminal is high (i.e. at the level of the high voltage supply node VDD). Among those NMOS transistors: $M_0$ has a low resistance value as its gate terminal is tied to the high voltage supply node VDD; $M_1$, controlled by a logical inversion of the binary code $C^{(1)}$, has a low resistance value when $C^{(1)}$ is 0 (i.e. low voltage or VSS) and a high resistance value when $C^{(1)}$ is 1 (i.e. high voltage or VDD); $M_2$, controlled by the logical inversion of the binary code $C^{(2)}$, has a low resistance value when $C^{(2)}$ is 0 and a high resistance value when $C^{(2)}$ is 1, and transistor $M_N$, controlled by the logical inversion of the binary code $C^{(N)}$, has a low resistance value when $C^{(N)}$ is 0 and a high resistance value when $C^{(N)}$ is 1. Thus, a greater value for the control code C leads to more binary codes being set to 1 among the N binary codes $C^{(1)}$, $C^{(2)}$, $C^{(3)}$ and so on, thus resulting in a higher resistance value for the variable resistor 505 and consequently a greater delay for a variable delay cell such as delay cell 501 of FIG. 5. The method for generating a logical inversion (e.g. generating $\sim C^{(1)}$ from $C^{(1)}$) is well known to those of ordinary skill in the art and thus not described in detail here.

Figure 7:
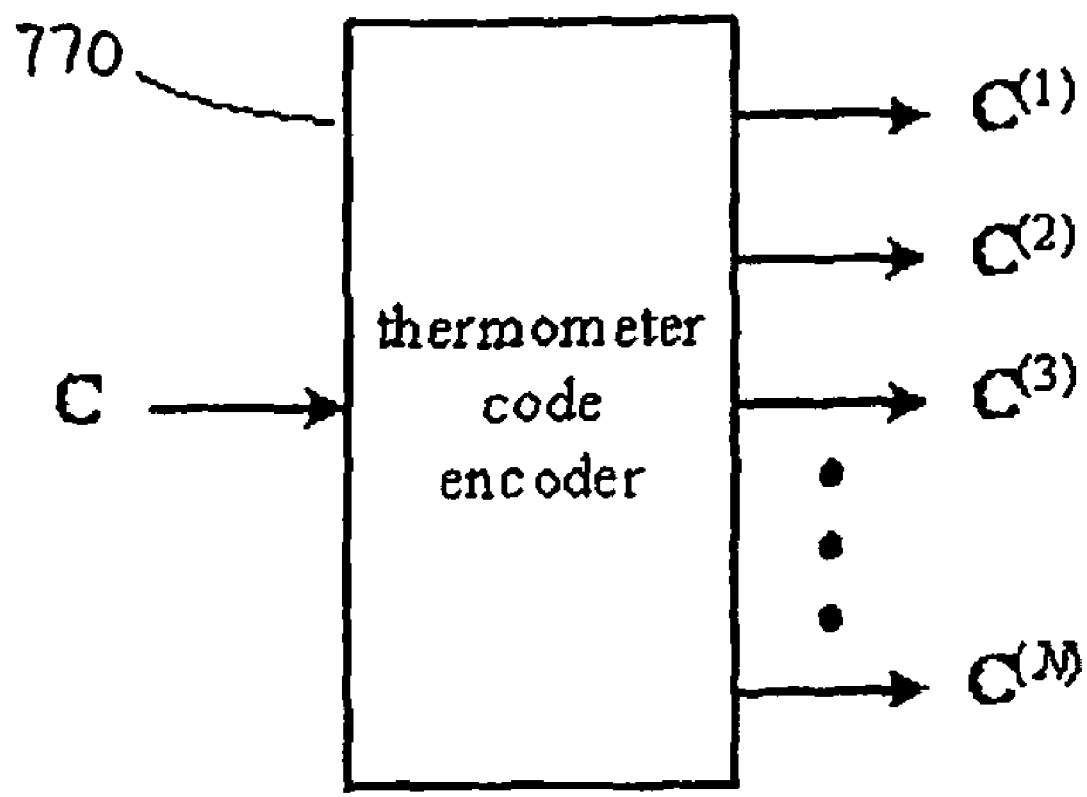
FIG. 7 shows a functional block diagram of a thermometer code encoder for a variable delay cell, according to an embodiment of the invention.

FIG. 7 shows a thermometer code encoder according to an embodiment of the invention. In various embodiments, a thermometer code encoder 770 is used to convert a control code C into N binary codes $C^{(1)}$, $C^{(2)}$, $C^{(3)}$, ..., $C^{(N)}$, where N>1. In various embodiments, the control code C has (N+1) possible values: 0, 1, 2, 3, ..., and N. When C is 0, all the N binary codes are 0; when C=1, all but one of the N binary codes are 0; when C=2, all but two of the N binary codes are 0; and so on. The following table shows an exemplary thermometer code encoding scheme for N=8.

| C | $C^{(1)}$ | $C^{(2)}$ | $C^{(3)}$ | $C^{(4)}$ | $C^{(5)}$ | $C^{(6)}$ | $C^{(7)}$ | $C^{(8)}$ |
|---|---|---|---|---|---|---|---|---|
| 0 | 0 | 0 | 0 | 0 | 0 | 0 | 0 | 0 |
| 1 | 1 | 0 | 0 | 0 | 0 | 0 | 0 | 0 |
| 2 | 1 | 1 | 0 | 0 | 0 | 0 | 0 | 0 |
| 3 | 1 | 1 | 1 | 0 | 0 | 0 | 0 | 0 |
| 4 | 1 | 1 | 1 | 1 | 0 | 0 | 0 | 0 |
| 5 | 1 | 1 | 1 | 1 | 1 | 0 | 0 | 0 |
| 6 | 1 | 1 | 1 | 1 | 1 | 1 | 0 | 0 |
| 7 | 1 | 1 | 1 | 1 | 1 | 1 | 1 | 0 |
| 8 | 1 | 1 | 1 | 1 | 1 | 1 | 1 | 1 |

In various embodiments, the thermometer code encoder receives a control code from a calibration controller and converts it to binary control signals to adjust the delay of a selected delay cell. It is understood that other coding schemes to generate the binary codes can be realized according to various embodiments.

Referring again to FIG. 5, in various embodiments, variable resistor 504 is replaced by a short circuit. In some embodiments, variable resistor 505 is replaced by a short circuit.

Figure 8:
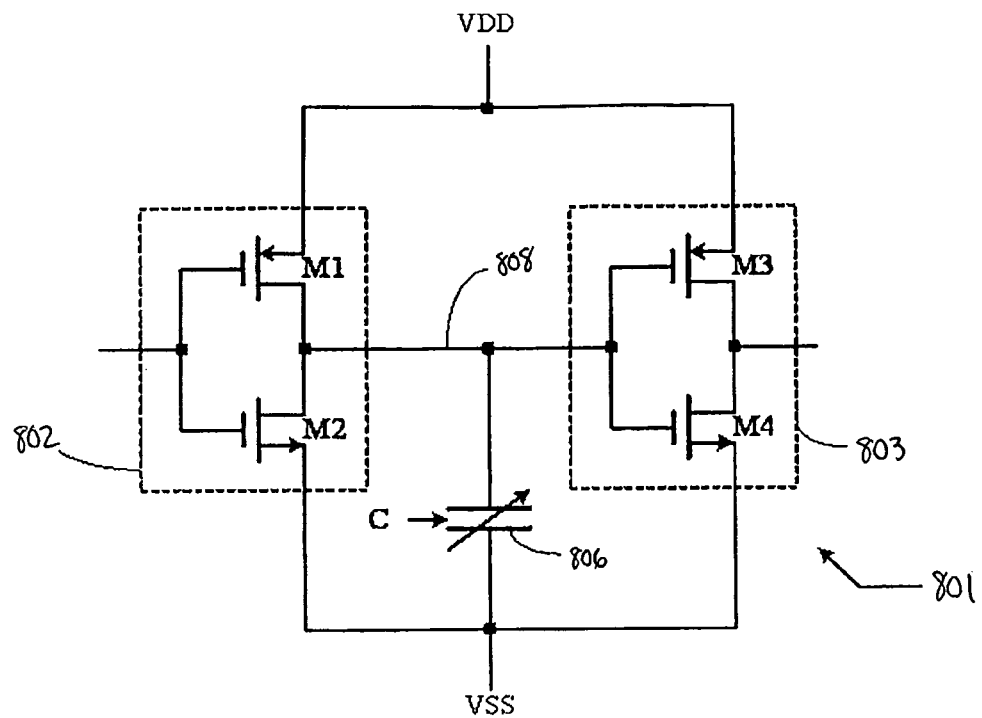
FIG. 8 shows a delay cell, according to an embodiment of the invention.

FIG. 8 shows an alternative delay cell according to an embodiment of the invention. Delay cell 801 comprises two CMOS (complementary metal-oxide semiconductor) inverters 802 and 803 configured in a cascade topology. Each inverter 802, 803 comprises a PMOS (p-channel metal-oxide semiconductor) transistor M1, M3 and a NMOS (n-channel metal-oxide semiconductor) transistor M2, M4. Inverter 802 is directly coupled to a high voltage supply node VDD via its "ceiling" terminal and to a low voltage supply node VSS via its "floor" terminal. Inverter 803 is directly coupled to a high voltage supply node VDD via its "ceiling" terminal and to a low voltage supply node VSS via its "floor" terminal. A variable capacitor 806 is incorporated as a variable inter-stage load between the inverters 802, 803. The variable capacitor 806 is inserted between the inter-stage node 808 and the low voltage supply node VSS and has a variable capacitance controlled by the control code C. In an embodiment, a greater value of the control code C leads to a greater capacitance for the variable capacitor 806 and thus a greater delay for the variable delay cell 801.

Figure 9:
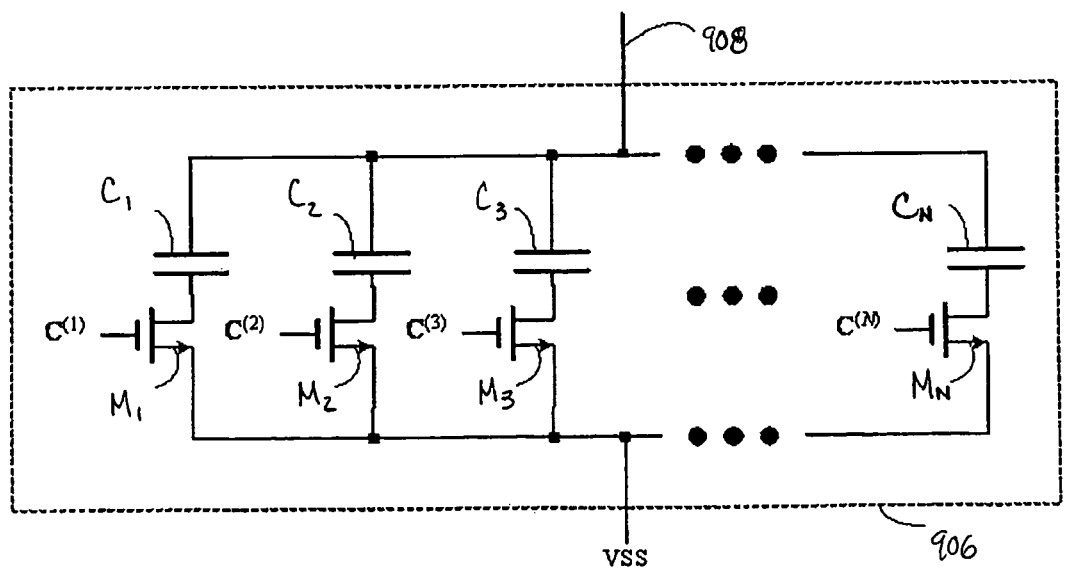
FIG. 9 shows a variable capacitor, according to an embodiment of the invention.

FIG. 9 shows a variable capacitor according to an embodiment of the invention. Variable capacitor 906 comprises a parallel connection of N sub-circuits, each sub-circuit comprising a capacitor $C_i$ coupled to the inter-stage node 908 on one end and to a drain terminal of a NMOS transistor $M_1$, $M_2$, $M_3$, ..., $M_N$ on the other end, wherein the source terminal of the NMOS transistor is coupled to the low voltage supply node VSS and the gate terminal of the NMOS transistor is coupled to a respective binary code among N binary codes $C^{(1)}$, $C^{(2)}$, $C^{(N)}$ and so on. Each NMOS transistor $M_1$, $M_2$, $M_3$, ..., $M_N$ serves as a switch to conditionally enable a respective capacitor. A greater value for the control code $C^{(i)}$ leads to more binary codes being set to 1 (or the high voltage VDD), resulting in more capacitors being enabled and thus a greater capacitance for the variable capacitor 906.

Figure 10A:
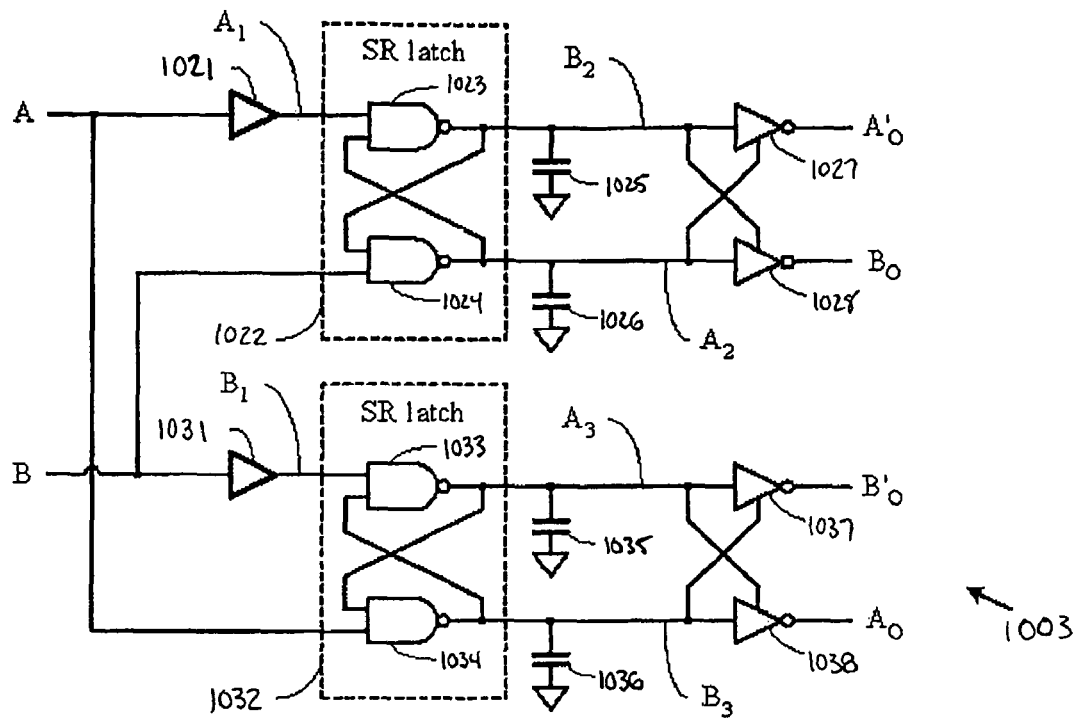
FIG. 10A shows a time amplifier, according to an embodiment of the invention.

FIG. 10A shows a time amplifier according to an embodiment. In various embodiments, time amplifier 203 of FIG. 2 is embodied by the illustrated time amplifier 1003. The time amplifier 1003 includes a first buffer 1021 for receiving a first input signal A and generating an intermediate signal $A_1$. Signal $A_1$ is a delayed version of signal A. The time amplifier 1003 further includes a second buffer 1031 for receiving a second input signal B and for generating an intermediate signal $B_1$. Signal $B_1$ is a delayed version of signal B. The time amplifier 1003 further includes a first SR latch 1022 and a second SR latch 1032. First SR latch 1022 comprises a first pair of cross-coupled NAND gates 1023, 1024 for receiving $A_1$ and B and for generating intermediate signals $B_2$ and $A_2$. The first SR latch 1022 coupled to a first pair of capacitors 1025, 1026 to provide a load at the output of the first SR latch 520, and coupled to a first inverter pair 1027, 1028 to receive $B_2$ and $A_2$ and to generate output signals $A'_O$ and $B_O$, respectively. Second SR latch 1032 comprises a second pair of cross-coupled NAND gates 1033, 1034 for receiving $B_1$ and A and for generating intermediate signals $A_3$ and $B_3$. The second SR latch 1032 coupled to a second pair of capacitors 1035, 1036 to provide a load at the output of the second SR latch 521, and coupled to a first inverter pair 1027, 1028 to receive $B_2$ and $A_2$ and to generate output signals $A'_O$ and $B_O$, respectively. The input to inverter 1027 can be provided as the power supply for inverter 1028 and vice versa. The input to inverter 1037 can be provided as the power supply for inverter 1038 and vice versa. It is understood that other time amplifier circuits can be realized according to various embodiments.

Figure 10B:
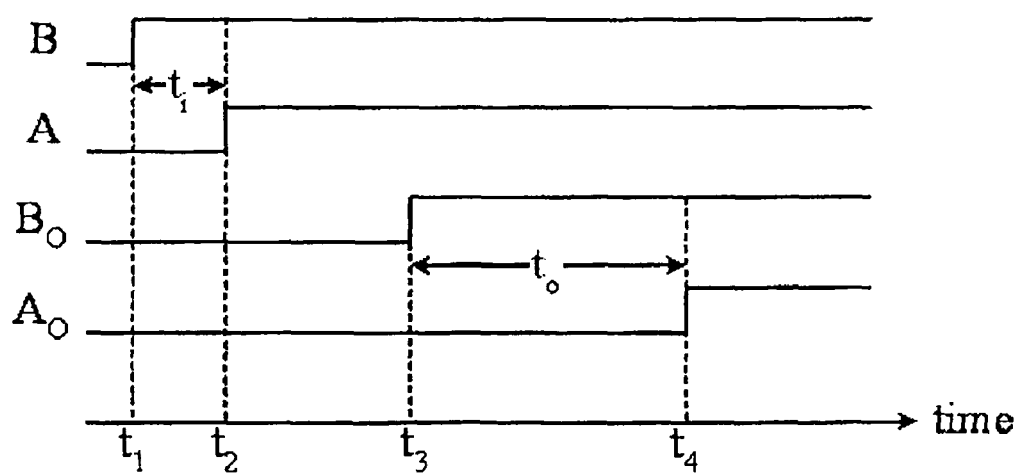
FIG. 10B shows an example timing diagram for the time amplifier of FIG. 10A.

FIG. 10B depicts a typical timing diagram for the time amplifier 1003 of FIG. 10A, according to various embodiments. Here, input signal B is a logical signal making a transition from a first logical value (0, or LOW) to a second logical value (1, or HIGH) at time instant $t_1$, and input signal A is also a logical signal making a transition from the first logical value (0, or LOW) to the second logical value (1, or HIGH) at time instant $t_2$, where $t_2-t_1=t_i$. Output signal $B_O$ is a logical signal making a transition from the first logical value (0, or LOW) to the second logical value (1, or HIGH) at time instant $t_3$, and output signal $A_O$ is also a logical signal making a transition from the first logical value (0, or LOW) to the second logical value (1, or HIGH) at time instant $t_4$, where $t_4-t_3=t_o$. Time amplifier 500 operates such that $t_o > t_i$, thus generating an output time difference greater than an input time difference. The ratio between the output time difference and the input time difference is defined as the gain, or amplification factor, of the time amplifier.

Figure 11A:
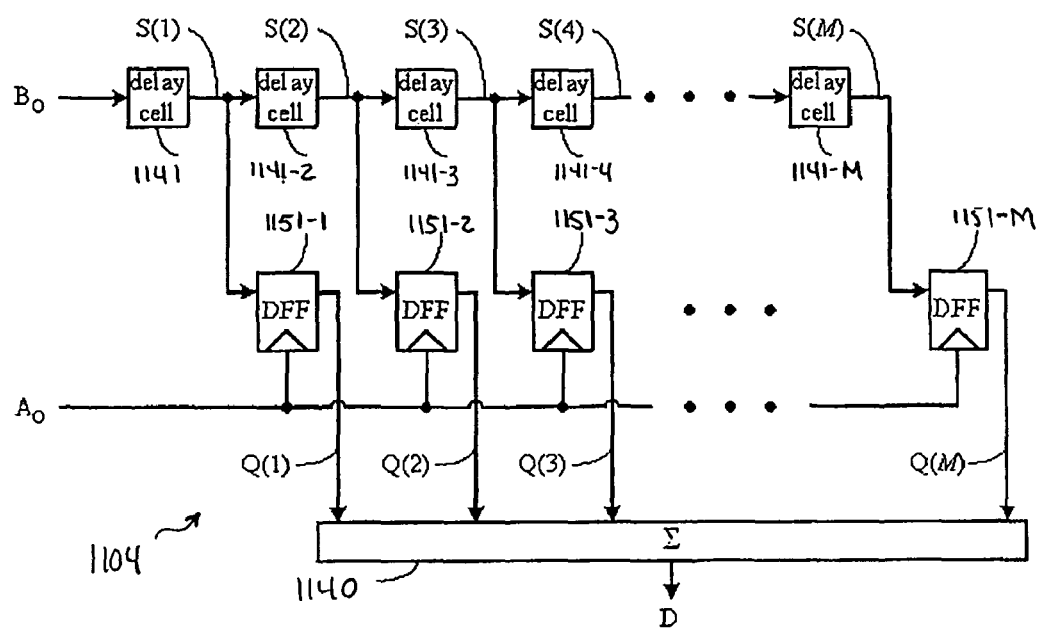
FIG. 11A shows a time-to-digital converter (TDC), according to an embodiment of the invention.

FIG. 11A shows a time-to-digital converter (TDC) according to an embodiment of the invention. In various embodiments, the TDC 230 of FIG. 2 is implemented using the TDC 1104 of FIG. 11A. The TDC 1104 includes a delay chain comprising a plurality of serial delay cells 1141-1, 1141-2, 1141-3, 1141-4, ..., 1141-M, an array of data flip-flops 1151-1, 1151-2, 1151-3, ..., 1151-M, and a summation operator 1140. The delay chain receives an input signal $B_O$ and generates a plurality of delayed signals S(1), S(2), ..., S(M). All the delay cells 1141-1, 1141-2, 1141-3, 1141-4, ..., 1141-M are substantially identical circuits, and therefore cause substantially the same amount of delay to their respective inputs. The delayed signals S(1), S(2), S(3), ..., S(M) from the delay cells 1141-1, 1141-2, ..., 1141-M, are provided as inputs to the array of data flip-flops 1151-1, 1151-2, ..., 1151-M, resulting in a plurality of decisions Q(1), Q(2), Q(3), ..., Q(M), respectively. For example, S(1) from delay cell 1141 is provided to data flip-flop 1151, resulting in decision Q(1). The data flip-flops 1151-1, 1151-2, ..., 1151-M, are triggered by the input signal $A_O$. The trigger edge of signal $A_O$ freezes any further state changes of data flip-flops 1151-1, 1151-2, ..., 1151-M. The TDC circuit 1104 detects and digitizes the delay between $A_O$ and $B_O$ using summation operator 1140. Summation operator 1140 receives the decisions Q(1), Q(2), Q(3), ..., Q(M) from the data flip-flops 1151-1, 1151-2, ..., 1151-M, and converts them into a digital output D representing an estimated time difference between $A_O$ and $B_O$. A greater value of D indicates a greater time difference between $A_O$ and $B_O$.

Figure 11B:
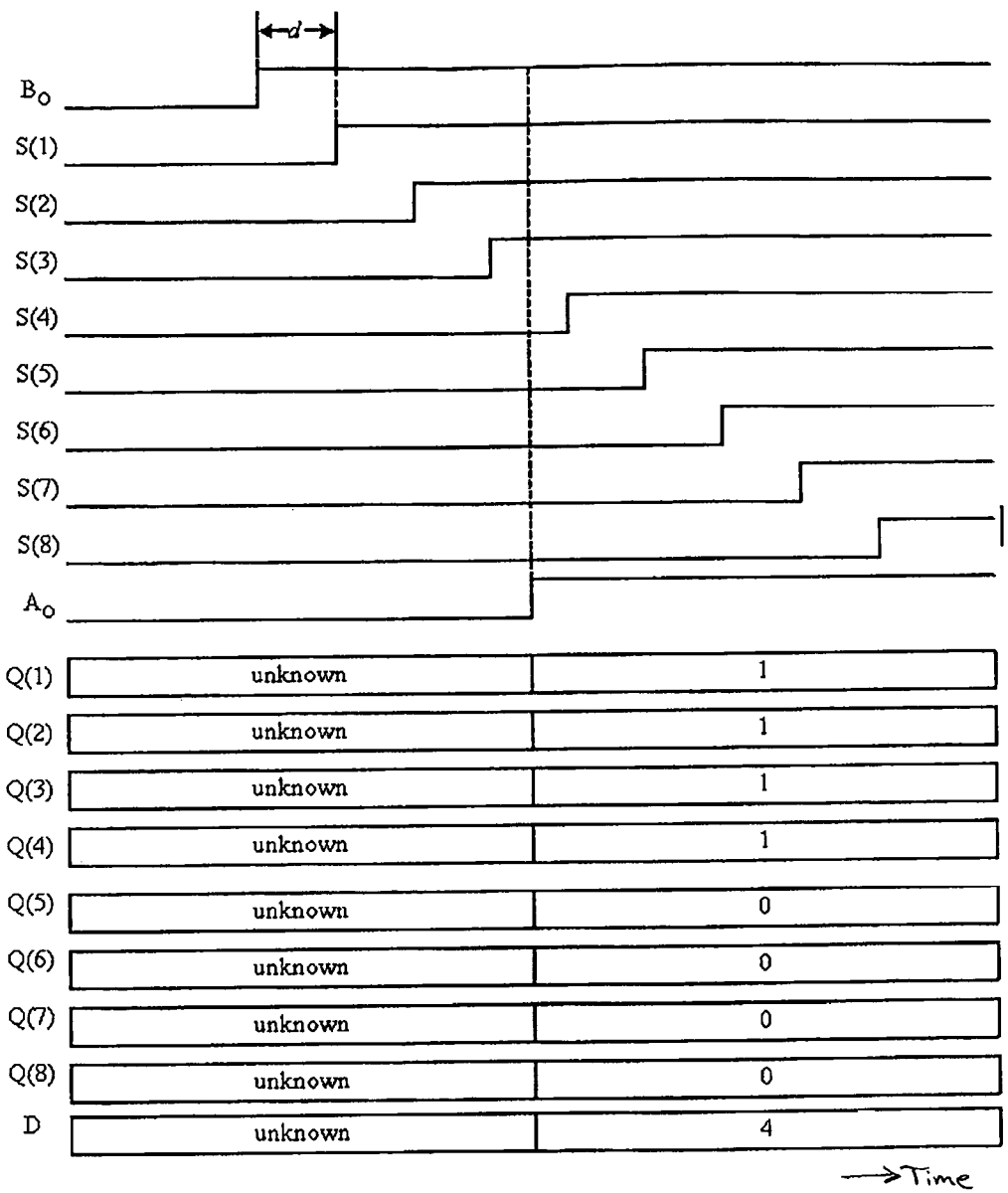
FIG. 11B shows an example timing diagram for the TDC of FIG. 11A.

FIG. 11B shows a timing diagram for TDC 1104 of FIG. 11A using 8 delay cells and 8 data flip-flops. In this example, the digital output D is obtained by summing decisions from all data flip-flops, i.e. D is equal to Q(1)+Q(2)+Q(3)+ ... + Q(8). The estimated timing difference between $A_O$ and $B_O$ in this diagram is thus D·d=4d, where d is the amount of delay caused by each delay cell. Note that the output code group for D in this embodiment is {0, 1, 2, ..., 8}. It is understood that other designs for a time-to digital-converter can be realized according to various embodiments.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method for calibrating a variable delay cell within a delay chain, the method comprising:
   receiving a target delay value;
   selectively amplifying a time difference between an output signal and an input signal of the variable delay cell to generate an amplified time difference;
   digitalizing the amplified time difference into a digital delay value; and
   adjusting the variable delay cell in accordance with a comparison between the digital delay value and the target delay value.

2. The method of claim 1, wherein adjusting the variable delay cell includes adjusting the variable delay cell such that the amplified time difference between the output signal and the input signal of the variable delay cell is essentially equal to the target delay value.

3. The method of claim 1, wherein receiving the target delay value includes measuring a delay interval of a second delay element within the delay chain.

4. The method of claim 1, wherein selectively amplifying a time difference includes multiplexing the output signal and the input signal of the variable delay cell to inputs of a time amplifier.

5. The method of claim 1, wherein adjusting the variable delay cell includes adjusting a resistive component of the variable delay cell.

6. The method of claim 1, wherein adjusting the variable delay cell includes adjusting a capacitive component of the variable delay cell.

7. A method of operating a self-calibrating delay chain, the method comprising:
receiving a target delay for the self-calibrating delay chain, the self-calibrating delay chain having a plurality of delay devices;
receiving an input signal at a first delay device having a first delay setpoint;
receiving the input signal at a time amplifier;
receiving a first delay signal from the first delay device at the time amplifier;
generating a time amplified input signal and a time amplified first delayed signal using the time amplifier;
generating a delay code related to an actual delay between the input signal and the first delayed signal using the time amplified input signal and the time amplified first delayed signal;
comparing the delay code to the target delay; and
adjusting the first delay setpoint of the first delay device such that subsequent actual delay of the first delay device is essentially equal to the target delay.

8. The method of claim 7, wherein receiving the target delay includes measuring a delay interval of a second delay device of the plurality of delay devices.

9. The method of claim 7, wherein generating the delay code includes receiving the time amplified input signal and the time amplified first delay signal at a time-to-digital converter (TDC).

10. The method of claim 9, wherein receiving the time amplified input signal includes passing the time amplified input signal through at least a portion of serial connected TDC delay devices, wherein upon delaying the time amplified input signal at a first TDC delay device of the serial connected TDC delay devices, a first TDC delay device output triggers an input of a second TDC device of the serial connected TDC delay devices.

11. The method of claim 10, wherein generating the delay code includes processing outputs of the serially connected TDC delay devices upon receiving the time amplified first delay signal at the TDC, wherein processing includes summing together an output of a flip-flop connected to the output of each serially connected delay element.

12. The method of claim 7, wherein adjusting the first delay setpoint includes adjusting a resistive component of the first delay device.

13. The method of claim 7, wherein adjusting the variable delay cell includes adjusting a capacitive component of the first delay device.

14. An apparatus comprising:
a delay chain including a plurality of delay cells, wherein the plurality of delay cells are configured in a cascade topology, each delay cell associated with a control code and each delay cell configured to generate a delay output signal at a delay interval related to the control code in response to an input signal; and
a calibration circuit, coupled to the delay chain, configured to calibrate the delay interval of a delay cell of the plurality of delay cells relative to a target delay interval, wherein the calibration circuit includes:
a multiplexer and a time-to-digital converter, the multiplexer comprising:
a selection input,
a plurality of multiplexer inputs, and
two multiplexer outputs, wherein the multiplexer is configured to connect two multiplexer inputs of the plurality of multiplexer inputs to the two multiplexer outputs based on a value of the selection input;
a time amplifier connected to the two multiplexer outputs, the time amplifier configured to lengthen temporal aspects of signals received from the two multiplexer outputs including the delay interval,
a time-to-digital converter connected to the time amplifier and configured to generate a digital output related to the delay interval, and
a calibration controller connected to the selection input of the multiplexer, the calibration controller configured to receive the digital output and generate a selection signal and the control codes for the plurality of delay cells.

15. The apparatus of claim 14, wherein the calibration controller includes a delay setpoint, and wherein the calibration controller is configured to compare the digital output to the delay setpoint to generate the control codes such that the delay interval of each delay cell is substantially equal.

16. The apparatus of claim 15, wherein the delay setpoint is a measured delay interval of a delay cell of the plurality of delay cells.

17. The apparatus of claim 14, wherein a delay cell of the plurality of delay cells includes a complementary metal-oxide semiconductor inverter.

18. The apparatus of claim 14, wherein a delay cell of the plurality of delay cells comprises a variable resistor configured to use the control code to adjust the delay interval of the delay cell.

19. The apparatus of claim 14, wherein a delay cell of the plurality of delay cells comprises a variable capacitor configured to use the control code to adjust the delay interval of the delay cell.

* * * * *

UNITED STATES PATENT AND TRADEMARK OFFICE
CERTIFICATE OF CORRECTION

PATENT NO. : 8,219,343 B2
APPLICATION NO. : 12/394846
DATED : July 10, 2012
INVENTOR(S) : Chia-Liang Lin Page 1 of 1

It is certified that error appears in the above-identified patent and that said Letters Patent is hereby corrected as shown below:

On the face page, in field (73) in "Assignee", in column 1, line 2, before "Science", insert --No. 2, Innovation Road II,--, therefor.

On the face page, in column 2, under "Other Publications", line 7, delete "12/304,888" and insert --12/394,888--, therefor.

Signed and Sealed this
Thirteenth Day of November, 2012

David J. Kappos
*Director of the United States Patent and Trademark Office*